United States Patent
Bakker et al.

(10) Patent No.: US 12,547,084 B2
(45) Date of Patent: Feb. 10, 2026

(54) POSITIONING DEVICE

(71) Applicant: DR. JOHANNES HEIDENHAIN GmbH, Traunreut (DE)

(72) Inventors: Arjan Bakker, Helenaveen (NL); Bart van Campen, Eindhoven (NL)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 237 days.

(21) Appl. No.: 18/508,306

(22) Filed: Nov. 14, 2023

(65) Prior Publication Data
US 2024/0168393 A1    May 23, 2024

(30) Foreign Application Priority Data

Nov. 18, 2022  (EP) .................................. 22208218

(51) Int. Cl.
*H01L 21/68* (2006.01)
*G01N 21/95* (2006.01)
*G03F 7/00* (2006.01)
*H01L 21/67* (2006.01)

(52) U.S. Cl.
CPC ..... *G03F 7/70716* (2013.01); *G01N 21/9501* (2013.01); *G03F 7/70775* (2013.01); *H01L 21/67259* (2013.01); *H01L 21/681* (2013.01); *G01N 2201/101* (2013.01)

(58) Field of Classification Search
CPC ............ G03F 7/70716; G03F 7/70775; G03F 7/70758; G03F 7/7085; G03F 7/709; G01N 21/9501; G01N 2201/101; H01L 21/67259; H01L 21/681; H01L 21/68785; G01B 11/03

USPC .............................. 356/500, 509; 355/72, 53
See application file for complete search history.

(56) References Cited

U.S. PATENT DOCUMENTS

| 9,979,262 B2 | 5/2018 | Maamari et al. |
| 2007/0058173 A1 | 3/2007 | Holzapfel |
| 2009/0033900 A1* | 2/2009 | Kanaya ............... G03F 7/70775 355/72 |

(Continued)

FOREIGN PATENT DOCUMENTS

| EP | 1019669 B1 | 7/2002 |
| EP | 1715384 B1 | 1/2010 |

(Continued)

*Primary Examiner* — Isiaka O Akanbi
(74) *Attorney, Agent, or Firm* — LEYDIG, VOIT & MAYER, LTD.

(57) ABSTRACT

A positioning device for positioning a stage relative to a tool mounted on a carrier device includes two intersecting linear axes disposed one above the other for pre-positioning the stage. A first magnetic levitation unit is configured to support the stage on one of the linear axes, the stage being actively movable for fine positioning in six degrees of freedom. A measuring head and first and second 6-DOF encoders are configured to determine a position of the stage relative to the carrier device. The measuring head is mounted on the other linear axis. The first 6-DOF encoder is disposed between the carrier device and the measuring head and the second 6-DOF encoder is disposed between the measuring head and the stage. A second magnetic levitation unit disposed on the other linear axis is configured to actively move the measuring head in the six degrees of freedom.

10 Claims, 5 Drawing Sheets

(56) References Cited

U.S. PATENT DOCUMENTS

| | | | |
|---|---|---|---|
| 2011/0007290 A1* | 1/2011 | Ichinose | G03F 7/709 355/53 |
| 2016/0291484 A1* | 10/2016 | Shibazaki | G03F 7/70108 |
| 2018/0046096 A1* | 2/2018 | Shibazaki | G01B 11/00 |
| 2018/0335705 A1* | 11/2018 | Butler | G03F 7/70766 |
| 2018/0348638 A1* | 12/2018 | Shibazaki | G03F 7/70483 |
| 2020/0400588 A1* | 12/2020 | Balan | G01N 21/9501 |

FOREIGN PATENT DOCUMENTS

| | | |
|---|---|---|
| EP | 1762828 B1 | 11/2014 |
| EP | 3264030 A1 | 1/2018 |
| EP | 3264179 A1 | 1/2018 |
| EP | 2443516 B1 | 1/2020 |

\* cited by examiner

POSITIONING DEVICE

CROSS REFERENCE TO RELATED APPLICATIONS

This application claims benefit to European Patent Application No. EP 22208218.2, filed on Nov. 18, 2022, which is hereby incorporated by reference herein.

FIELD

The present invention relates to a positioning device that can be used, for example, to position a wafer on a wafer stage very accurately relative to a lens of an inspection apparatus or of an exposure machine, which lens is mounted on a carrier device.

BACKGROUND

The positioning of a movable object in six degrees of freedom relative to a stationary object is a recurring engineering task. In a Cartesian coordinate system, these six degrees of freedom are the three orthogonal linear spatial directions, here denoted by X, Y, Z, and the three rotations dX, dY and dZ about these linear spatial directions. To be able to position an object relative to another object using closed-loop drive systems, it is necessary to measure the relative position in all degrees of freedom. A position-measuring device used for this purpose is often referred to as an encoder. Very different designs of encoders are known. The measurement can be based on very different physical principles. For example, there are known optical, magnetic, capacitive, or inductive structures on one of the two objects, the scanning of which with a scanning head suitable for the structures provides signals from which the desired position information can be obtained. Depending on the encoder, position information can be obtained for at least one, several, or all six degrees of freedom.

EP 1019669 B1 provides an example of an encoder that can provide information regarding the position of an object relative to another object. For this purpose, one object carries a scale with a cross grating. The other object carries a scanning head with three scanning means for two linear spatial directions in the plane of the scale (in-plane degrees of freedom), from which the rotation about the third spatial direction (out-of-plane degree of freedom, here perpendicular to the plane of the scale) can also be obtained. In addition, the scanning head contains three distance sensors, each of which provides position values with respect to the out-of-plane degree of freedom, thus enabling the determination of the out-of-plane degree of freedom and the rotations about the in-plane degrees of freedom.

U.S. Pat. No. 9,979,262 B2 describes a positioning device for a wafer stage mounted on the cross member of a gantry arrangement. Due to the high accelerations of the wafer stage necessitated by throughput requirements, the cross member is subjected to large forces and is not well suited as a reference for position measurements. Therefore, a second cross member is carried along, which second cross member does not have a wafer stage and is better suited as a position reference because of its lower mass. A first encoder detects the position of the wafer stage relative to the second cross member, and a second encoder detects the position of the second cross member relative to the stationary reference. For each encoder, a plurality of scanning heads and a plurality of scales are used, so that the respective positions can be determined in all six degrees of freedom. Such an encoder is also referred to here as a "6-DOF encoder." The second cross member thus serves as a movable reference structure via which the position of the wafer stage relative to the stationary reference can be determined by means of two encoders.

EP 1762828 B1 describes a scanning head whose scanning optics can measure both an in-plane degree of freedom (in the grating plane) and an out-of-plane degree of freedom (perpendicular to the grating plane) by scanning an optical grating. Both dimensions can be measured with very high accuracy in the sub-nanometer range. By combining differently oriented scanning heads of this type, a 6-DOF encoder for position measurement in six degrees of freedom can be provided.

EP 1715384 B1 describes a positioning device for a wafer. The wafer stage is disposed on a magnetic levitation unit which can position the stage in six degrees of freedom, but only with small movements. For large displacements in a horizontal plane parallel to the mounting plane, two intersecting linear axes are disposed under the wafer stage, the upper one carrying the magnetic levitation unit. The positioning of the wafer stage relative to a stationary tool, such as the lens of an exposure apparatus, is accomplished by detecting the position of the wafer stage relative to a co-moving measuring head with a first 6-DOF encoder, and by detecting the position of the measuring head relative to the stationary tool with a second 6-DOF encoder. The co-moving measuring head is mounted on the lower of the two intersecting linear axes and thus remains close to the wafer stage when the wafer stage is moved with the lower linear axis. Although the movements with the intersecting linear axes do not lead to correspondingly large changes in the scanning distance of the two 6-DOF encoders, these changes, which are caused, for example, by guiding errors, are still too large to determine very accurate positions. It is possible, for example, to model or calibrate to a certain extent the effect of the changes in the scanning distance in the 6-DOF encoders or the tilt of the scanning heads with respect to the scales using an encoder model; however, high-accuracy position analysis is difficult to achieve in this arrangement and requires a very substantial effort, or may fail in the case of excessive fluctuations.

SUMMARY

In an embodiment, the present invention provides a positioning device for positioning a stage relative to a tool mounted on a carrier device. The positioning device includes two intersecting linear axes disposed one above the other in a vertical direction for pre-positioning the stage in two linearly independent directions. A first magnetic levitation unit is configured to support the stage on a first one of the two linear axes, the stage being actively movable for fine positioning in six degrees of freedom. A measuring head and a first and a second 6-DOF encoder are configured to determine a position of the stage relative to the carrier device. The measuring head is mounted on a second one of the two linear axes. The first 6-DOF encoder is disposed between the carrier device and the measuring head and the second 6-DOF encoder is disposed between the measuring head and the stage. A second magnetic levitation unit is disposed on the second one of the two linear axes and is configured to actively move the measuring head in the six degrees of freedom.

BRIEF DESCRIPTION OF THE DRAWINGS

Subject matter of the present disclosure will be described in even greater detail below based on the exemplary figures.

All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention provides a positioning device by means of which a stage can be positioned relative to a tool with further increased accuracy by further improving the detection of the stage position relative to the tool.

In an embodiment, the present invention provides a positioning device for positioning a stage relative to a tool mounted on a carrier device. The positioning device includes two intersecting linear axes which are disposed one above the other in a vertical direction and used for pre-positioning the stage in two linearly independent directions, the stage being supported on one of the two linear axes by means of a first magnetic levitation unit and being actively movable for fine positioning in six degrees of freedom. The position of the stage relative to the carrier device can be determined via a measuring head mounted on the other of the two linear axes and a first and a second 6-DOF encoder in that the first 6-DOF encoder is disposed between the carrier device and the measuring head and the second 6-DOF encoder is disposed between the measuring head and the stage. For this purpose, the measuring head is actively movable in six degrees of freedom by means of a second magnetic levitation unit on the other of the two linear axes.

Since the measuring head disposed between the stage and the carrier device is now also mounted on a magnetic levitation unit, the measuring head can compensate for all unwanted movements except for the desired movements in the two linear axes. Thanks to the now significantly reduced fluctuations in the scanning distance or in the tilts, the two 6-DOF encoders can measure more accurately and the calibration and modeling effort is considerably reduced.

Figure 1:
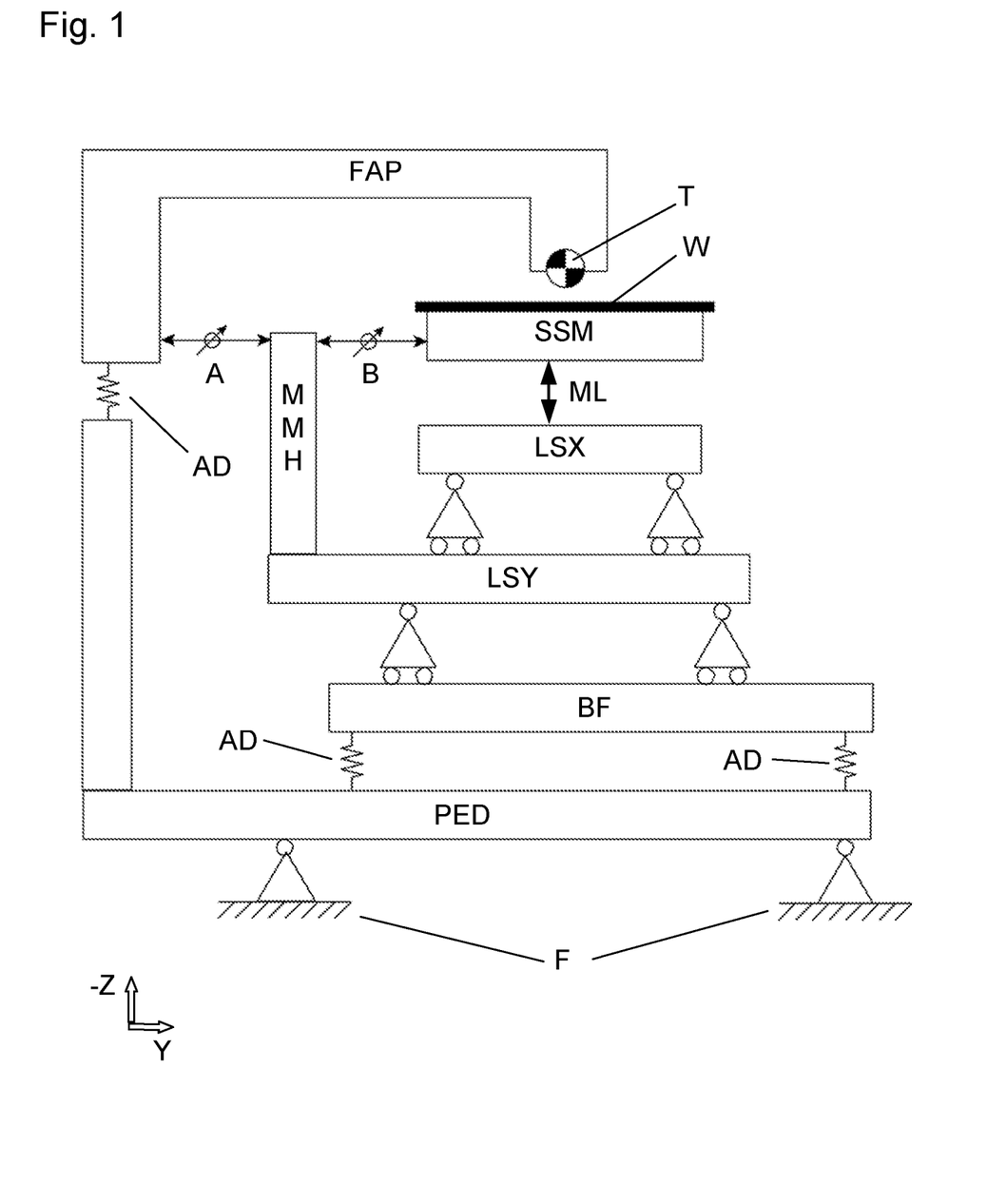
FIG. 1 shows a schematic of a positioning device, as known from the prior art.

FIG. 1 shows very schematically a positioning device that is constructed according to principles known in the art and which is not an embodiment of the present invention.

On a pedestal PED, which itself stands, for example, on the floor F of a machine shop or clean room, a base frame BF is mounted in a vibrationally isolated manner by means of active dampers AD. Base frame BF carries intersecting linear axes LSY and LSX which are disposed one above the other and which are capable of moving a stage SSM for placement of a wafer W thereon in the X and Y directions parallel to bottom F to allow tool T to reach any point on wafer W.

Stage SSM is mounted on a magnetic levitation unit ML, which in turn is mounted on upper linear axis LSX. Magnetic levitation unit ML is capable of moving the stage by small amounts in all six degrees of freedom and is used for fine positioning, even in the Z-direction, for which no other actuators are provided. All rotational degrees of freedom dX, dY, dZ are also adjustable to a certain extent via magnetic levitation unit ML. A movable measuring head MMH co-moves with lower linear axis LSY in the Y-direction. During such movements in the Y-direction, the distance between movable measuring head MMH and stage SSM does not change, or only small movements result from mechanical errors in the system. A 6-DOF encoder B measures the relative position between movable measuring head MMH and stage SSM in all six degrees of freedom. Movements of upper linear axis LSX (perpendicular to the plane of the drawing) can be detected by encoder B if scales of encoder B along the edge of stage SSM perpendicular to the plane of the drawing are of sufficient length.

A carrier device FAP carrying a tool T intended for processing a wafer W is also mounted on pedestal PED in a vibrationally isolated manner by means of a further active damper AD. The tool may be a lens for exposure or inspection of wafer W. In any case, wafer W must be positioned very accurately relative to tool T. To this end, an additional 6-DOF encoder A measures all six degrees of freedom of the movement between carrier device FAP and movable measuring head MMH. When the measurements of the two encoders A and B are added together, one obtains the position of stage SSM relative to carrier device FAP and thus also relative to tool T.

However, carrier device FAP moves on active damping device AD relatively freely relative to pedestal PED and in isolated relationship with respect to the remainder of the assembly. Encoder A, in particular, must therefore be able to compensate for large fluctuations in the scanning distance and the tilt of its scanning heads with respect to the scales on measuring head MMH. This requires a large amount of effort for calibrating an encoder model as well as a high computational effort. Moreover, if certain limits are exceeded, it is no longer possible to obtain an accurate measurement.

Figure 2:
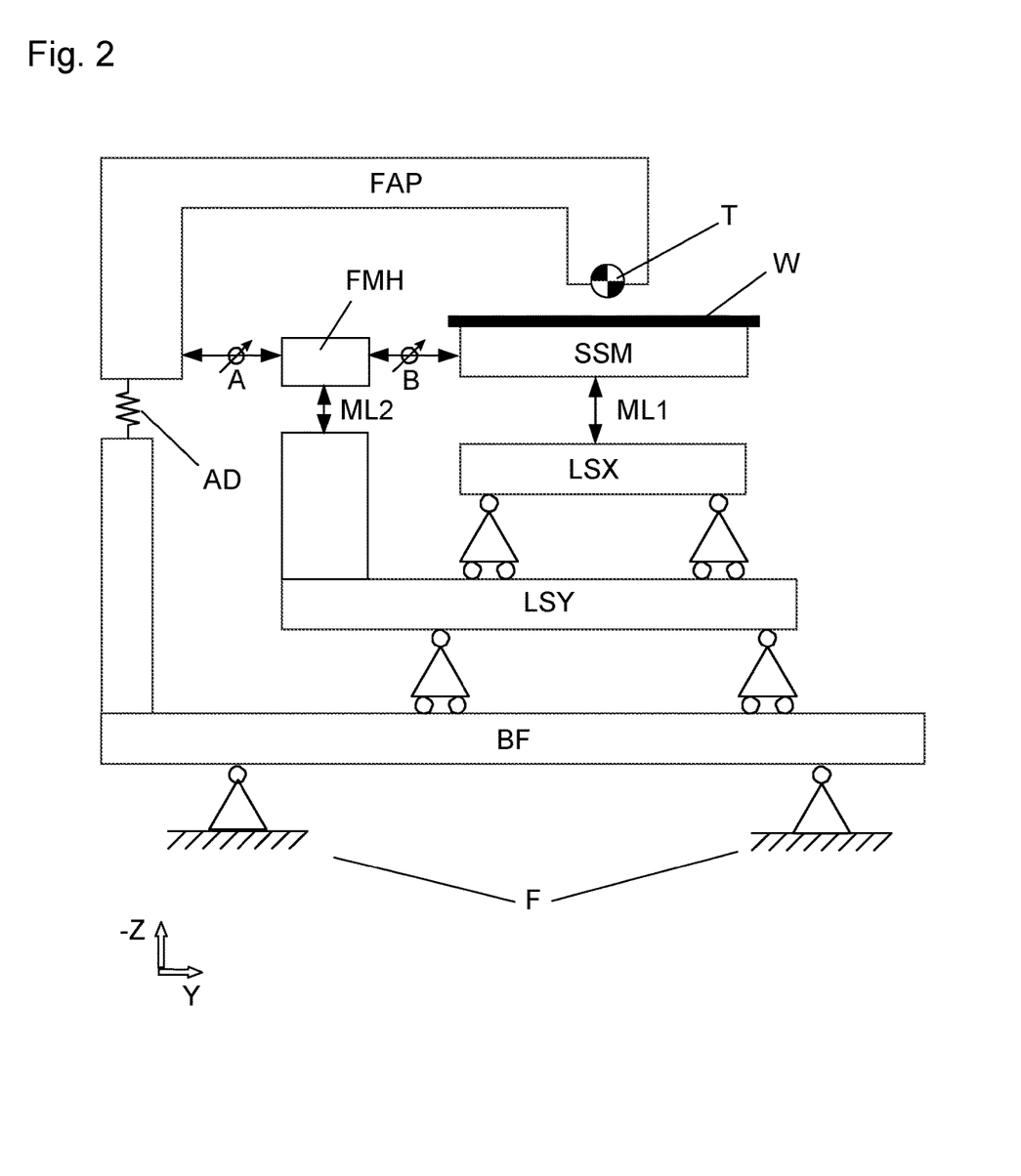
FIG. 2 shows a schematic of a positioning device according to an exemplary embodiment of the present invention.

Therefore, FIG. 2 shows an inventive positioning device that is improved with respect to a decisive detail and in which the problem mentioned occurs to a much lesser extent.

First of all, base frame BF is disposed directly on floor F for reasons of simplification. However, mounting on a pedestal PED, as previously shown in FIG. 1, constitutes an alternative embodiment of the present invention. The arrangement of the two linear axes LSX and LSY, a first magnetic levitation device ML1, and stage SSM remains unchanged compared to FIG. 1. Again, the carrier device FAP carrying tool T is isolated from the ground (here from base frame BF) via an active damping device AD.

The decisive difference from the arrangement shown in FIG. 1 lies in the fact that measuring head FMH is now also carried by a second magnetic levitation unit ML2. Because of this, the relative movement between carrier device FAP and measuring head FMH detected by 6-DOF encoder A can be determined and compensated for through suitable control of second magnetic levitation unit ML2. In this way, the fluctuations in the scanning distance and in the tilts of the scanning heads of 6-DOF encoder A with respect to the scales on carrier device FAP are minimized, the measurement is significantly simplified, and its accuracy is crucially increased.

Figure 3:
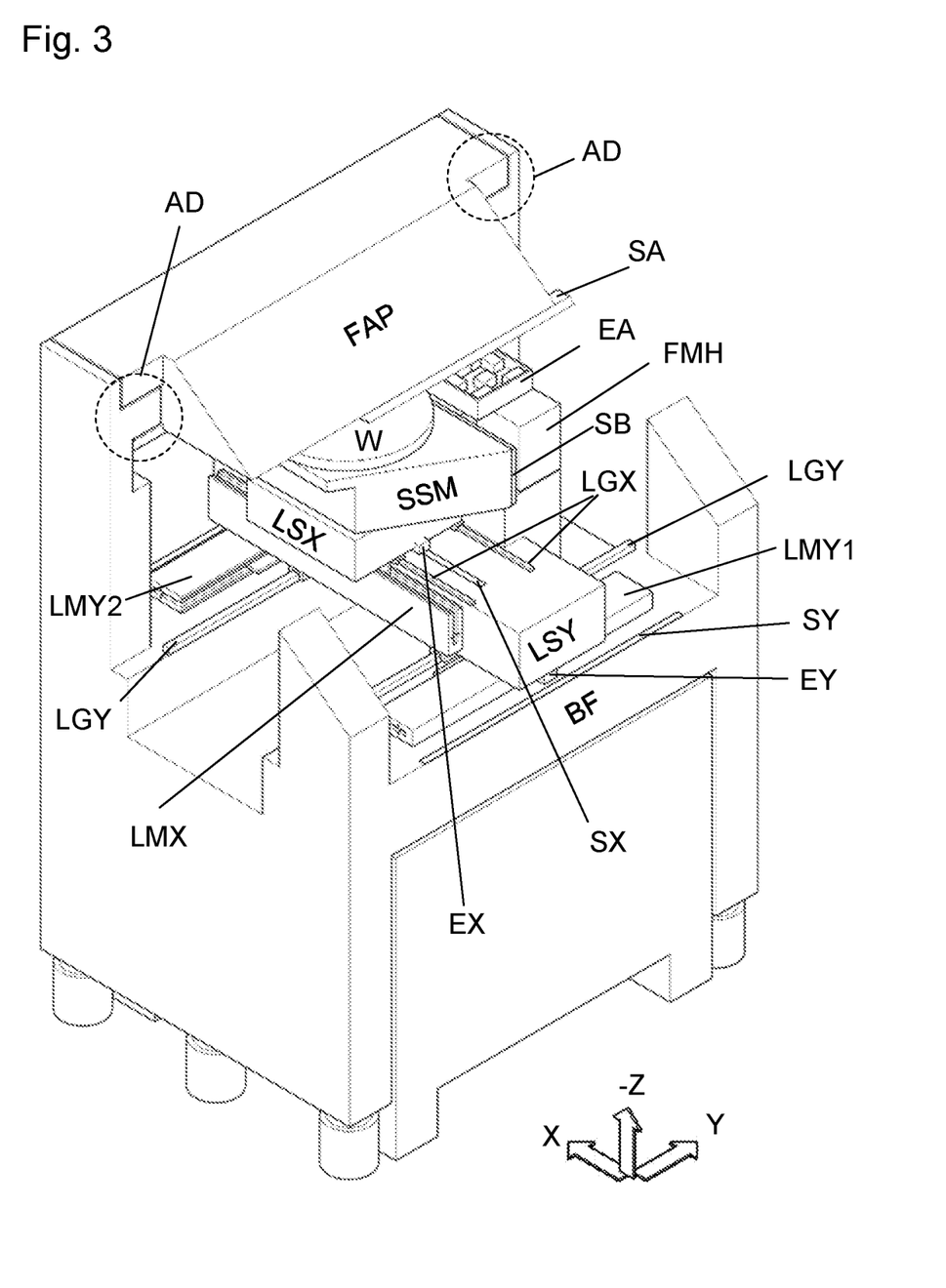
FIG. 3 shows a specific embodiment of a positioning device according to the present invention.

Since FIGS. 1 and 2 show the respective measuring concepts only very schematically, a specific embodiment of the present invention will be explained with reference to FIG. 3. FIG. 3 shows a positioning device with some portions partly removed to reveal the inner construction thereof.

In FIG. 3, intersecting linear axes LSY and LSX can be seen again on base BF. These are movably supported by two respective linear guides LGY, LGX and driven by linear motors LMY1, LMY2 and LMX. Encoders EY, EX, whose scanning heads scan linear scales SY and SX, are available for these linear axes LSY, LSX. Thus, linear axes LSY, LSX can be positioned by a higher-level control system.

First magnetic levitation unit ML1 is located between stage SSM (with wafer W placed thereon) and upper linear axis LSX. Measuring head FMH is co-moved with lower linear axis LSY via a second magnetic levitation unit ML2. This second magnetic levitation unit ML2 enables compensating movements of measuring head FMH in six degrees of freedom.

Carrier device FAP, together with tool T, is connected to base frame BF on both sides via active damping devices AD. The movements of carrier device FAP made possible by these two damping devices AD lead to the mentioned movements between carrier device FAP and scanning heads EA of 6-DOF encoder A, which can be compensated for by second magnetic levitation unit ML2.

Figure 4:
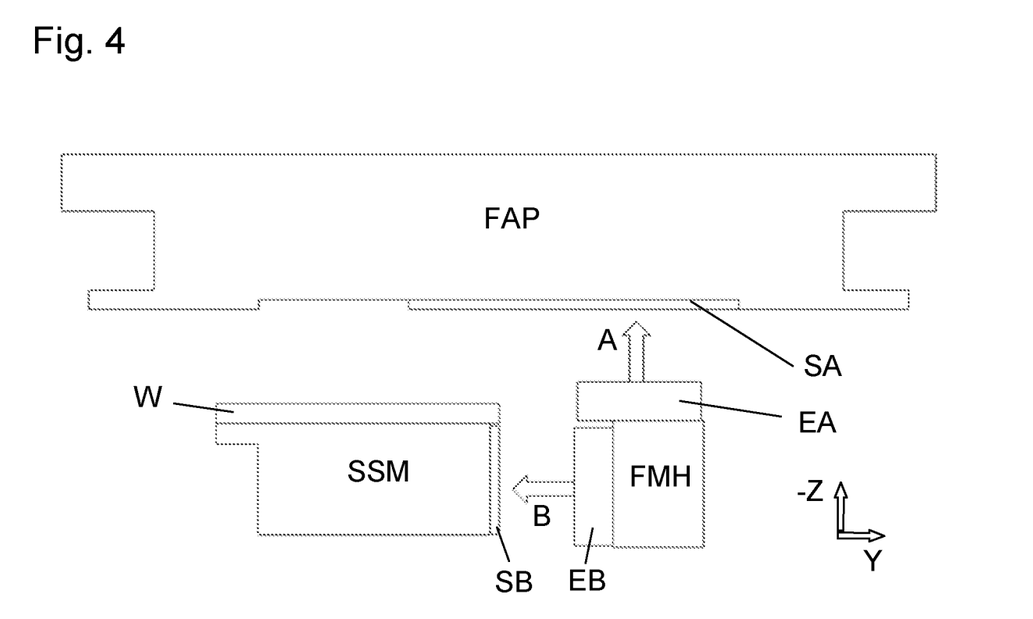
FIG. 4 and FIG. 5 show details of the arrangement of the 6-DOF encoders of FIG. 3 in different views.
Figure 5:
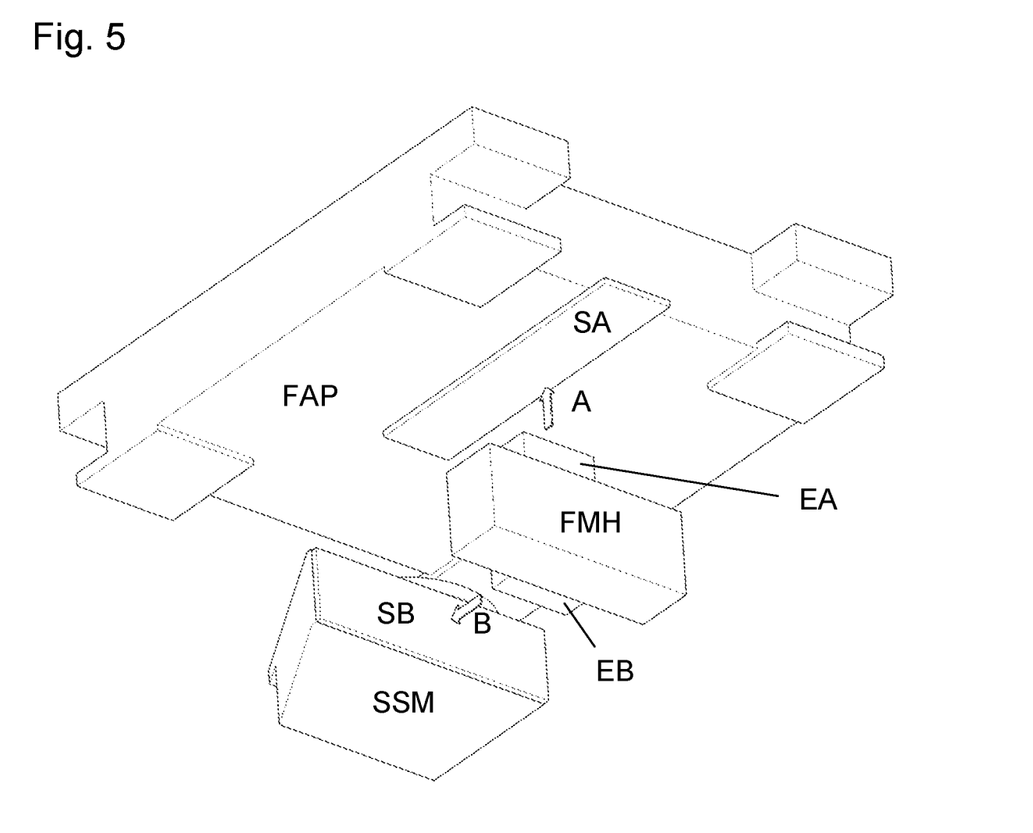

FIGS. 4 and 5, when viewed in conjunction with FIG. 3, make it easier to recognize the arrangement of 6-DOF encoders A, B. For this purpose, only the relevant parts of the arrangement of FIG. 3 are shown in FIGS. 4 and 5 in different views.

Scanning heads or scanning head groups EA, EB of 6-DOF encoders A, B can be seen on different sides of measuring head FMH. Scanning heads EA are oriented toward one or more scales SA attached to carrier device FAP. Scanning heads EA and scales SA together form 6-DOF encoder A. A possible embodiment of these scales SA and scanning heads EA will be described further below.

Scanning heads EB of 6-DOF encoder B are oriented toward one or more scales SB on stage SSM. Scanning heads EB and scales SB together form 6-DOF encoder B.

With suitable arrangement of scales SA, SB and scanning heads EA, EB, 6-DOF encoders A, B can thus provide position determination in six degrees of freedom.

Figure 6:
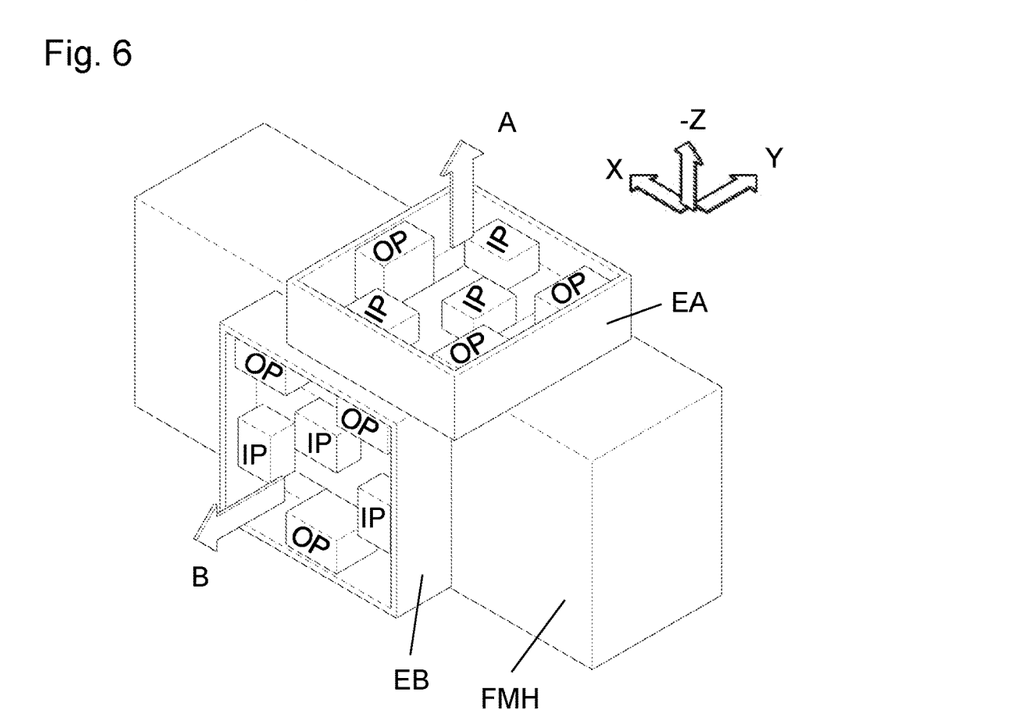
FIG. 6 shows details of the scanning heads of the 6-DOF encoders of FIG. 3.

FIG. 6 shows measuring head FMH and the scanning head groups EA, EB mounted thereon. Each of scanning head groups EA, EB includes a plurality of scanning heads IP, OP, which can measure either in directions parallel to the scales (in-plane) or perpendicular thereto (out-of-plane). As explained in the introduction, there are also known scanning heads that can measure components in both directions. In any case, the number of scanning heads IP, OP of a scanning head group EA, EB and their measurement directions must together enable measurement of six degrees of freedom between measuring head FMH and stage SSM (6-DOF encoder B) and between measuring head FMH and carrier device FAP (6-DOF encoder A), respectively.

Figure 7:
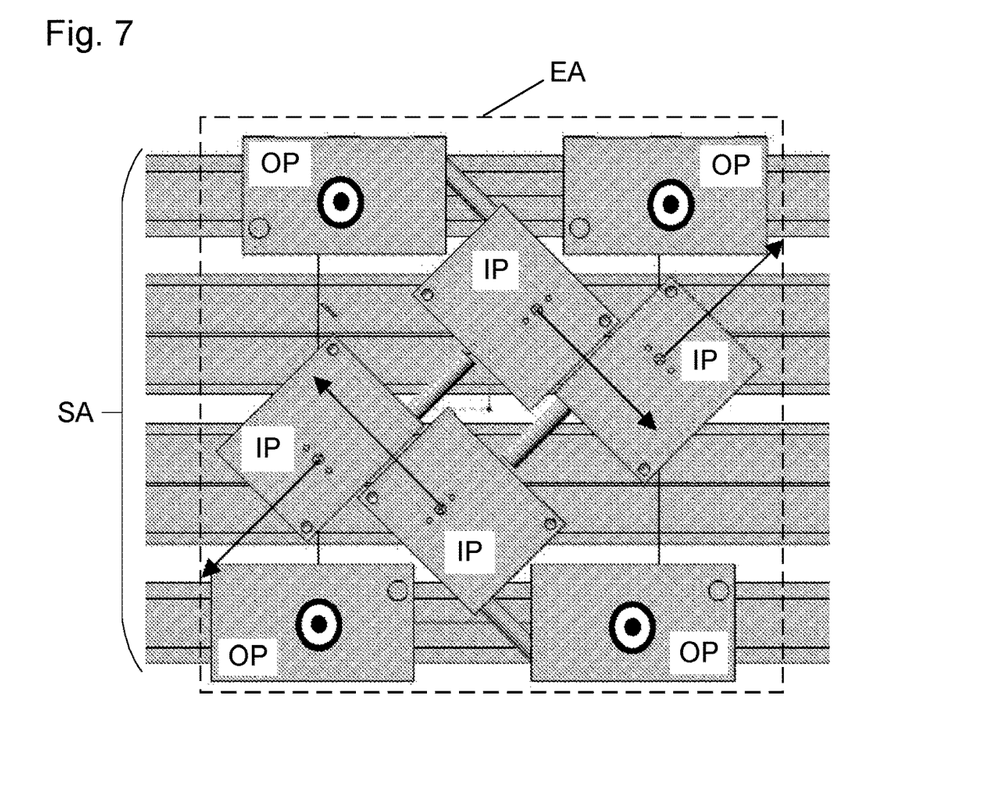
FIG. 7 shows details of the scales of the 6-DOF encoders of FIG. 3.

FIG. 7 shows a scanning head group EA including a plurality of scanning heads IP, OP, which scan a plurality of parallel scales SA. To be able to measure all six degrees of freedom, scanning heads IP, which measure parallel to the plane of scales SA, are arranged at an angle with respect to one another. Scanning heads OP, which are capable of measuring perpendicularly to the plane of scales SA, are located in the corners of scanning head group EA so as to be spaced a maximum distance apart from one another and to thus be able to measure tilts between scanning heads IP, OP and the plane of scales SA more accurately. To be able to determine all six degrees of freedom, it is necessary that neither scanning heads IP nor scanning heads OP be on one line.

Scales SA, SB may be separate elements or may be markings written directly onto the components of the positioning device. Due to the achievable high accuracy, optical structures on the scales are preferred, but all principles known from the above-cited prior art for the production of scales are also possible here.

A cross-grating plate could also be installed instead of a plurality of parallel scales SA. By using scanning heads EA capable of measuring both in-plane and out-of-plane, the set measurement task could be solved with just three scanning heads.

With the arrangement shown in FIGS. 3 through 7 and the mentioned embodiments thereof, the position of stage SSM relative to tool T on carrier device FAP can thus be measured very accurately by dividing this measurement into two position measurements, each relative to measuring head FMH. The second magnetic levitation unit ML2 provides that the measuring head FMH can be controlled in such a way that the measurements of the position relative to carrier device FAP remain very accurate, even when carrier device FAP is moved by active damping devices AD.

A possible concept for controlling the positioning device is to compensate for all unwanted movements between measuring head FMH and carrier device FAP via second magnetic levitation device ML2. Measuring head FMH therefore always follows carrier device FAP, except in the case of a desired movement of stage SSM in the Y-direction (selected by a higher-level control system). In addition, stage SSM always follows measuring head FMH via its first magnetic levitation device ML1, except in the event of a desired movement of the stage in the X-direction (selected by the higher-level control system).

An alternative concept of controlling the first magnetic levitation unit ML1 of the positioning device is to add the determined position values of the two 6-DOF encoders A, B and to thereby cause stage SSM to directly follow carrier device FAP (except for the selected movements in X and Y). As before, the measuring head also follows carrier device FAP. In this way, the requirements on the control of second magnetic levitation unit ML2 are slightly reduced and the errors are better distributed among the two 6-DOF encoders. However, adding the position values is not easy, as the two 6-DOF encoders A, B constantly change their orientation with respect to each other, and this change must be taken into account in the summation. Relative tilts, in particular, lead to considerable computational effort.

Magnetic levitation devices ML1, ML2 may, in accordance with well-known principles, be Lorentz or reluctance actuators or combinations of both. They may be gravity-compensated in a known manner and/or have a very low to vanishing stiffness; i.e., may be movable (almost) without forces.

Where position measurements are mentioned herein, an absolute or a relative position measurement or the measurement of position changes can be meant. For example, a wafer W usually carries special alignment marks to determine its absolute position relative to tool T. Relative position measurements with 6-DOF encoders A, B are then sufficient to control the positioning device by means of a higher-level control system. However, absolute position measurements via suitably coded scales SA, SB are also possible.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A positioning device for positioning a stage relative to a tool mounted on a carrier device, the positioning device comprising:
    two intersecting linear axes disposed one above the other in a vertical direction for pre-positioning the stage in two linearly independent directions;
    a first magnetic levitation unit configured to support the stage on a first one of the two linear axes, the stage being actively movable for fine positioning in six degrees of freedom;
    a measuring head and a first and a second 6-DOF encoder configured to determine a position of the stage relative to the carrier device, the measuring head being mounted on a second one of the two linear axes, the first 6-DOF encoder being disposed between the carrier device and the measuring head and the second 6-DOF encoder being disposed between the measuring head and the stage; and
    a second magnetic levitation unit disposed on the second one of the two linear axes and configured to actively move the measuring head in the six degrees of freedom.

2. The positioning device as recited in claim 1, wherein the first and second 6-DOF encoders each include scanning head groups which are arranged on sides of the measuring head and have measuring heads which, in the case of the first 6-DOF encoder, are oriented toward at least one first scale mounted on the carrier device and, in the case of the second 6-DOF encoder, are oriented toward at least one second scale mounted on the stage.

3. The positioning device as recited in claim 2, wherein the scanning head groups each include scanning heads which enable position measurement parallel to and perpendicular to a plane of the respectively scanned first and second scales.

4. The positioning device as recited in claim 3, wherein the scanning heads are arranged in the scanning head groups in a manner that allows detection of tilts in the plane of the respectively scanned first and second scales and of rotation about a normal to the plane of the respectively scanned first and second scales.

5. The positioning device as recited in claim 1, wherein the two intersecting linear axes are mounted on a base frame, and wherein a damping device is disposed between the carrier device and the base frame to reduce transmission of vibrations.

6. The positioning device as recited in claim 1, wherein the tool is a lens of a camera or of an exposure device.

7. The positioning device as recited in claim 1, wherein the stage is a wafer stage.

8. A method for operating the positioning device according to claim 1, the method comprising:
    controlling the first and second magnetic levitation units by a higher-level control system in such a manner that the measuring head follows the carrier device by keeping constant values measured by the first 6-DOF encoder; and
    controlling the stage so that the stage either follow the measuring head by keeping constant the values measured by the second 6-DOF encoder or the stage follows the carrier device by keeping constant a sum of values measured by the first and second 6-DOF encoders so as to compensate for unwanted variations in the position of the stage relative to the tool.

9. The method as recited in claim 8, wherein a change in the position of the stage relative to the tool commanded by the higher-level control system is not compensated for.

10. The positioning device as recited in claim 1, wherein the first one of the two linear axes is arranged above the second one of the two linear axes, the first one of the two linear axes being arranged between stage and the second one of the two linear axes.

* * * * *